United States Patent
Kim et al.

(12) 
(10) Patent No.: US 8,710,670 B2
(45) Date of Patent: Apr. 29, 2014

(54) INTEGRATED CIRCUIT PACKAGING SYSTEM WITH COUPLING FEATURES AND METHOD OF MANUFACTURE THEREOF

(75) Inventors: MinJung Kim, Kwang-ju (KR); DaeSik Choi, Seoul (KR); WonIl Kwon, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 28 days.

(21) Appl. No.: 13/326,116

(22) Filed: Dec. 14, 2011

(65) Prior Publication Data

US 2013/0154107 A1 Jun. 20, 2013

(51) Int. Cl.
*H01L 23/48* (2006.01)

(52) U.S. Cl.
USPC ............ 257/774; 257/E21.597; 257/E23.011; 438/667

(58) Field of Classification Search
None
See application file for complete search history.

(56) References Cited

U.S. PATENT DOCUMENTS

| | | |
|---|---|---|
| 7,129,112 B2 | 10/2006 | Matsuo |
| 7,354,798 B2 | 4/2008 | Pogge et al. |
| 7,786,008 B2 | 8/2010 | Do et al. |
| 7,973,415 B2 | 7/2011 | Kawashita et al. |
| 2008/0237881 A1 | 10/2008 | Dambrauskas et al. |
| 2010/0252935 A1* | 10/2010 | Lee et al. .................. 257/774 |

OTHER PUBLICATIONS

U.S. Appl. No. 12/820,491, filed Jun. 22, 2010, Chi et al.

* cited by examiner

*Primary Examiner* — Mamadou Diallo
(74) *Attorney, Agent, or Firm* — Ishima

(57) ABSTRACT

A method of manufacture of an integrated circuit packaging system includes: providing a wafer substrate having an active side containing a contact; forming a through silicon via extending through the wafer substrate electrically connected to the contact having a via width; forming a first coupling feature extending from a top side of the through silicon via; and forming a second coupling feature on the side of the through silicon via opposite the first coupling feature.

20 Claims, 9 Drawing Sheets

INTEGRATED CIRCUIT PACKAGING SYSTEM WITH COUPLING FEATURES AND METHOD OF MANUFACTURE THEREOF

TECHNICAL FIELD

The present invention relates generally to integrated circuit packaging system, and more particularly to a system with coupling features.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for integration and cost reduction.

Thus, a need still remains for an integrated circuit packaging system providing integration, space savings, and low cost manufacturing. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including providing a wafer substrate having an active side containing a contact; forming a through silicon via extending through the wafer substrate electrically connected to the contact having a via width; forming a first coupling feature extending from a top side of the through silicon via; and forming a second coupling feature on the side of the through silicon via opposite the first coupling feature.

The present invention provides an integrated circuit packaging system including a wafer substrate having an active side; a contact formed directly on the wafer substrate; a through silicon via extending through the wafer substrate electrically connected to the contact and having a via width; a first coupling feature extending from a top side of the through silicon via; and a second coupling feature on the side of the through silicon via opposite the first coupling feature.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
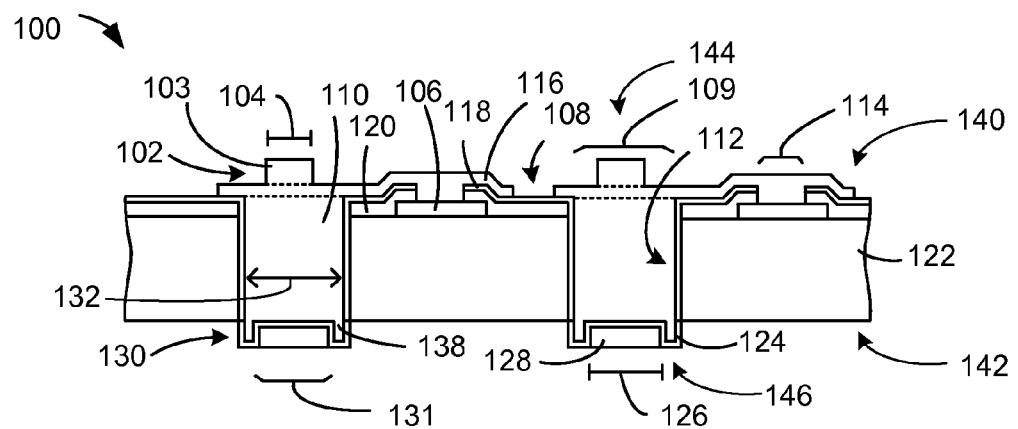
FIG. 1 is a cross-sectional view of an integrated circuit packaging system along a line 1-1 of FIG. 2 in a first embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means that there is direct contact between elements. The term "directly on" means that there is direct contact between one element and another element without an intervening element. The term "processing" as used herein includes stamping, forging, patterning, exposure, development, etching, depositing, cleaning, and/or removal of the material as required in forming a described structure.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 2:
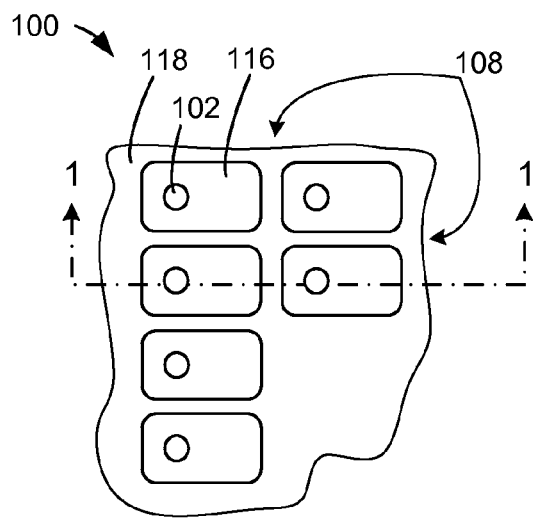
FIG. 2 is a partial top view of the integrated circuit packaging system.

Referring now to FIG. 1, therein is shown a cross-sectional view of an integrated circuit packaging system 100 along a line 1-1 of FIG. 2 in a first embodiment of the present invention. The integrated circuit packaging system 100 can include a through silicon via 110 in a wafer substrate 122.

The integrated circuit packaging system 100 can include the through silicon via 110 extending through the wafer substrate 122. The through silicon via 110 is an electrically conductive element for transferring electrical signals from one side of the wafer substrate 122 to the opposite side. The through silicon via 110 can be formed from a conductive material, such as copper, gold, nickel, tin, an alloy, or a combination thereof.

The integrated circuit packaging system 100 can include a via recess 109. The via recess 109 is an opening extending through the wafer substrate 122. The through silicon via 110 is formed in the via recess 109.

The through silicon via 110 can have a via width 132. The via width 132 is the horizontal distance from one side of the through silicon via 110 to an opposite side defined by a line passing through the geometric center of the through silicon via 110.

The integrated circuit packaging system 100 can include an active side 140 and a back side 142. The active side 140 is the side having active circuitry, such as integrated transistor circuits, formed and fabricated on the wafer substrate 122. The back side 142 is on the opposite side from the active side 140.

The wafer substrate 122 is a structure for supporting and connecting an integrated circuit including providing electrical connection through the structure. The wafer substrate 122 can be an integrated circuit, silicon wafer, a gallium-arsenide structure, a silicon on insulator structure, or a combination thereof. The wafer substrate 122 can include electrical circuitry such as an integrated circuit on the active side 140.

The through silicon via 110 can include a first coupling feature 102 formed on a top side 144 of the through silicon via 110 and a second coupling feature 130 formed on a bottom side 146 of the through silicon via 110. The first coupling feature 102 can be implemented as a via post 103, a via rim 138 having a via hole 131, a protrusion, an opening, or a combination thereof. The second coupling feature 130 can be implemented as the via post 103, the via rim 138 having the via hole 131, a protrusion, an opening, or a combination thereof. The through silicon via 110 can be implemented having the first coupling feature 102 different from the second coupling feature 130 or the first coupling feature 102 being the same as the second coupling feature 130.

The first coupling feature 102 is an electrically conductive structure for forming a connection with the second coupling feature 130 of another of the integrated circuit packaging system 100. The second coupling features 130 is an electrically conductive structure for forming a connection with the first coupling feature 102 of another of the integrated circuit packaging system 100.

The top side 144 is on the same side as the active side 140 of the wafer substrate 122. The bottom side 146 of the through silicon via 110 is on the same side as the back side 142 of the wafer substrate 122.

The first coupling feature 102 can be cylindrical shaped, although it is understood that the first coupling feature 102 can have other shapes including round, square, polygonal, or a combination thereof. The first coupling feature 102 has a first coupling feature diameter 104. The first coupling feature diameter 104 is the horizontal distance across the first coupling feature 102 as measured by a line (not show) passing through the geometric center of the first coupling feature 102. The first coupling feature diameter 104 is smaller than the via width 132.

The second coupling feature 130 can have a complementary shape for accommodating the first coupling feature 102 of another of the integrated circuit packaging system 100. The second coupling feature 130 can be shaped cylindrically, round, square, polygonal, or a combination thereof.

The second coupling feature 130 has a second coupling feature diameter 126. The second coupling feature diameter 126 is the distance from one side of the second coupling feature 130 to the other side as measured by a line (not shown) drawn through the geometric center of the second coupling feature 130. The second coupling feature diameter 126 can be larger than the first coupling feature diameter 104. For example, the via hole 131 has a complementary shape and a larger diameter for accommodating the via post 103.

In another example, the second coupling feature 130 can include the via rim 138 having the via hole 131. The via rim 138 can be an electrically conductive, ring shaped structure around the circumference of the bottom side 146 of the through silicon via 110. The via rim 138 can have the same diameter as the via width 132.

The first coupling feature 102 can form an interlocking connection with the second coupling feature 130 of another of the integrated circuit packaging system 100. Interlocking is defined as forming a connection preventing relative motion between elements of the connection.

The first coupling feature 102 and the second coupling feature 130 are electrically conductive elements that can be used with the through silicon via 110 to transfer electrical signals from the active side 140 of the wafer substrate 122 to the back side 142. The first coupling feature 102 and the second coupling feature 130 can be formed from a conductive material, such as copper, gold, nickel, tin, an alloy, or a combination thereof.

The integrated circuit packaging system 100 can include a contact 106 electrically connected to the through silicon via 110. The contact 106 can be directly on or over the active side 140 of the wafer substrate 122. The contact 106 is a conductive element for forming electrical connections to an integrated circuit (not shown) in the wafer substrate 122. The contact 106 can be formed from a conductive material, such as copper, gold, nickel, tin, an alloy, or a combination thereof.

The integrated circuit packaging system 100 can include a first insulation layer 120 formed directly on or over the wafer substrate 122 and the contact 106. The first insulation layer 120 can be formed from an electrically insulating material such as a polymer, polyimide, an oxide, or a combination thereof. The first insulation layer 120 is for electrically insulating elements from other elements.

The integrated circuit packaging system 100 can include a second insulation layer 118 directly on or over the first insulation layer 120, the via recess 109, and the wafer substrate 122. The second insulation layer 118 is directly on a via recess sidewall 112 between the wafer substrate 122 and the through silicon via 110. The second insulation layer 118 can be formed from an electrically insulating material such as a polymer, polyimide, an oxide, or a combination thereof. The second insulation layer 118 is for electrically insulating elements from other elements.

The integrated circuit packaging system 100 can include a metal layer 116 directly on or over the second insulation layer 118, the through silicon via 110, and the contact 106. The metal layer 116 is an electrically conductive structure for conducting electric signals. The metal layer 116 can be formed from a conductive material such as copper, gold, nickel, an alloy, or a combination thereof.

The metal layer 116 can form the through silicon via 110. The metal layer 116 can be formed directly on or over the second insulation layer 118 in the via recess 109 to form the through silicon via 110. The metal layer 116 can electrically connect the contact 106, the through silicon via 110, the first coupling feature 102, and the second coupling feature 130.

The metal layer 116 can be patterned to include an inter-via gap 108. The inter-via gap 108 is an opening in the metal layer 116 exposing a portion of the second insulation layer 118 between the contact 106 and the through silicon via 110. The inter-via gap 108 can surround pairs of the through silicon via 110 and the contact 106 that are coupled electrically by the metal layer 116.

The integrated circuit packaging system 100 can include a contact opening 114 over the contact 106 through the second insulation layer 118 and the first insulation layer 120. The metal layer 116 can fill the contact opening 114 electrically connecting the contact 106, the metal layer 116, and the through silicon via 110.

In an illustrative example, the through silicon via 110 can include a barrier layer 124 directly on the second coupling feature 130. The barrier layer 124 is for inhibiting diffusion between adjacent structural elements. The barrier layer 124 completely covers the second coupling feature 130 and can act as a solder wettable layer. The barrier layer 124 can be formed from conductive material such as nickel, gold, an alloy or a combination thereof. The barrier layer 124 is optional.

The integrated circuit packaging system 100 can include a conductive adhesive cap 128, such as a solder cap, on the second coupling feature 130. The conductive adhesive cap 128 is directly on the barrier layer 124 and inside the second coupling feature 130. The conductive adhesive cap 128 can be formed from a conductive adhesive material, such as solder, solder paste, conductive resin, or a combination thereof. The barrier layer 124 can be for inhibiting the diffusion of material from the conductive adhesive cap 128 to the through silicon via 110.

In an illustrative example, the first coupling feature 102 can be implemented as the via post 103. The via post 103 can range between 10 and 20 μm in height and between 10 to 20 μm in diameter.

In another illustrative example, the second coupling feature 130 can be implemented as the via rim 138 having the via hole 131. The via hole 131 can range between 20 and 40 μm in depth and between 20 to 40 μm in interior diameter. The via rim 138 can range between 10 and 20 μm in wall thickness. The via width 132 of the through silicon via 110 can range between 40 and 80 μm.

It has been discovered that the present invention provides improved joint strength by inhibiting diffusion of the conductive adhesive cap 128 into the through silicon via 110. Forming the barrier layer 124 on the second coupling feature 130 between the conductive adhesive cap 128 and the through silicon via 110 inhibits diffusion and electro-migration of the material of the conductive adhesive cap 128.

It has been discovered that the present invention increases solder joint reliability by preventing solder bridges forming between two of the through silicon via 110. Forming the metal layer 116 around the first coupling feature 102 provides a conductive overflow area for the material displaced by connecting the first coupling feature 102 and the second coupling feature 130.

It has been discovered that the present invention provides improved functionality by forming the metal layer 116 connecting the contact 106, the through silicon via 110, the first coupling feature 102, and the second coupling feature 130. The metal layer 116 can be electrically connected with the through silicon via 110 to provide electrical conductivity from the contact 106 to the back side 142 of the wafer substrate 122 and the active side 140 of the wafer substrate 122. The through silicon via 110 can provide vertical connectivity from the electrical circuitry coupled to the contact 106 to external elements coupled to the first coupling feature 102 or the second coupling feature 130.

It has been discovered that the present invention provides improved joint strength because of the increased surface area of the connection between the first coupling feature 102 and the second coupling feature 130 as compared to a flat surface. The first coupling feature 102 provides additional surface area because of the non-flat shape of the first coupling feature 102. The second coupling feature 130 provides increased surface area because the shape of the second coupling feature 130 is complimentary to the shape of the first coupling feature 102.

It has been discovered that the present invention provides improved joint strength and horizontal stability because of the interlock structure formed by the first coupling feature 102 connected to the second coupling feature 130. The first coupling feature 102 and the second coupling feature 130 form an interlocking structure when stacked together. The interlocking structure can inhibit lateral motion between the first coupling feature 102 and the second coupling feature 130.

It has been discovered that the present invention provides improved joint quality and more reliable alignment between two of the through silicon via 110. The first coupling feature 102 has a smaller diameter than the second coupling feature 130 allowing the first coupling feature 102 to act as a guide and self-align inside the second coupling feature 130.

Referring now to FIG. 2, therein is shown a partial top view of the integrated circuit packaging system 100. The integrated circuit packaging system 100 can be an integrated circuit package having the second insulation layer 118, the metal layer 116, the first coupling feature 102, and the inter-via gap 108.

The integrated circuit packaging system 100 can include the metal layer 116 directly on or over the second insulation layer 118. The first coupling feature 102 is formed directly on or over the metal layer 116. One of the metal layers 116 can be separated from another of the metal layer 116 by one of the inter-via gap 108.

Figure 3:
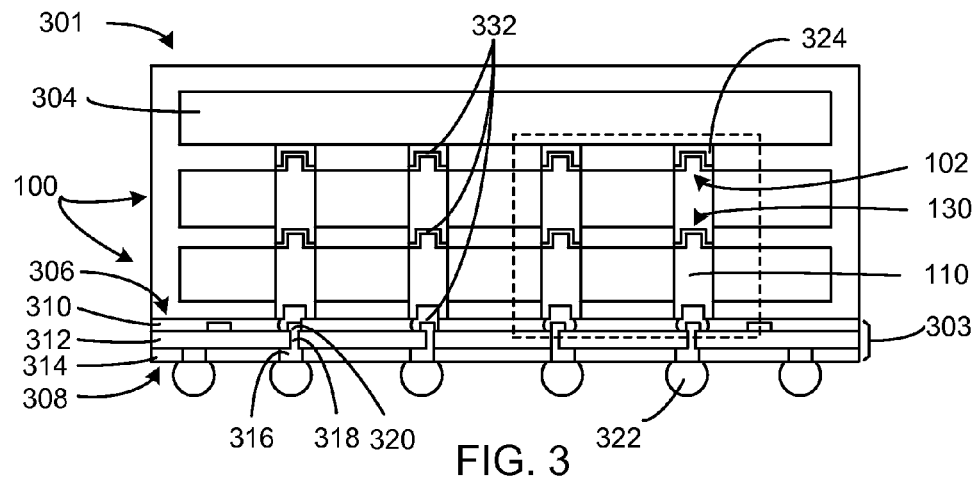
FIG. 3 is a cross-sectional view of a multi-chip package of the integrated circuit packaging system.

Referring now to FIG. 3, therein is shown a cross-sectional view of a multi-chip package 301 of the integrated circuit packaging system 100. The multi-chip package 301 can include a top integrated circuit package 304 mounted over a first of the integrated circuit packaging system 100 and a second of the integrated circuit packaging system 100 mounted over an external substrate 303. The first of the integrated circuit packaging system 100 can be mounted over the second of the integrated circuit packaging system 100.

The multi-chip package 301 can include the external substrate 303, such as a printed circuit board, laminated substrate, or a combination thereof. For example, the external substrate 303 can include a top solder resist layer 310 (SR) on a component side 306 of the external substrate 303, a bottom solder resist layer 314 on a system side 308 of the external substrate 303, and a pre-preg layer 312 (PPG) formed between the top solder resist layer 310 and the bottom solder resist layer 314.

The component side 306 is on the same side as the active side 140 of FIG. 1 of the wafer substrate 122 of FIG. 1. The system side 308 is opposite the component side 306 and on the same side as the back side 142 of FIG. 1 of the wafer substrate 122.

The external substrate 303 can include a vertical substrate interconnect 318 having a top mounting pad 320 exposed on the component side 306 and a bottom mounting pad 316 on the system side 308. The vertical substrate interconnect 318 is an electrical connector extending through the external substrate 303 from the component side 306 to the system side 308 for transferring electrical signals. For example, the vertical substrate interconnect 318 can include a via, a pin, a wire, a conductive path, or a combination thereof.

The external substrate 303 can include an external interconnect 322, such as solder balls or solder posts, mounted on the bottom mounting pad 316. The external interconnect 322 can be electrically connected to the vertical substrate interconnect 318.

The multi-chip package 301 can include the top integrated circuit package 304 mounted over the first of the integrated circuit packaging system 100. The top integrated circuit package 304 can have a third coupling feature 324 on the side closest to the first of the integrated circuit packaging system 100. The third coupling feature 324 is an electrically conductive element, implemented as the via post 103 of FIG. 1 or the via rim 138 of FIG. 1 having the via hole 131 of FIG. 1, for coupling with an external element.

The top integrated circuit package 304 can be mounted to the first of the integrated circuit packaging system 100 by attaching the third coupling feature 324 to the first coupling feature 102 of the first of the integrated circuit packaging system 100. The first coupling feature 102 can be attached to the third coupling feature 324 with a conductive adhesive layer 332 of the third coupling feature 324. The third coupling feature 324 is electrically connected to the first coupling feature 102 and the through silicon via 110 of the first of the integrated circuit packaging system 100.

The multi-chip package 301 can include the first of the integrated circuit packaging system 100 mounted over the second of the integrated circuit packaging system 100. The first coupling feature 102 of the second of the integrated circuit packaging system 100 can be connected to the second coupling feature 130 of the first of the integrated circuit packaging system 100. The first coupling feature 102 and the second coupling feature 130 can be attached by the conductive adhesive cap 128 of FIG. 1. The through silicon via 110 of first of the integrated circuit packaging system 100 is electrically connected to the through silicon via 110 of the second of the integrated circuit packaging system 100.

The multi-chip package 301 can include the second of the integrated circuit packaging system 100 mounted over the external substrate 303. The second coupling feature 130 of the through silicon via 110 can be attached to the top mounting pad 320 with the conductive adhesive layer 332 including the conductive adhesive cap 128. The through silicon via 110 is electrically connected to the top mounting pad 320, the vertical substrate interconnect 318, the bottom mounting pad 316, the external interconnect 322, and the contact 106 of FIG. 1.

It has been discovered that the present invention increases solder joint reliability by preventing solder bridges forming when attaching the through silicon via 110 to the external substrate 303. Mounting the second coupling feature 130, implemented as the via rim 138 having the via hole 131, over a mounting pad on the external substrate 303 prevents solder bridges because the second coupling feature 130 can enclose the periphery of the solder bond.

It has been discovered that the present invention provides an improved vertical interconnection between elements by connected the first coupling feature 102, implemented as the via post 103, of one of the integrated circuit packaging system 100 to the second coupling feature 130, implemented as the via rim 138 having the via hole 131, of another of the integrated circuit packaging system 100. By forming interlocking connectors on the top and bottom of the integrated circuit packaging system 100, multiple instances of the integrated circuit packaging system 100 can be connected together in close proximity.

It has been discovered that the present invention provides improved joint strength because of the increased surface area resulting from attaching the second coupling feature 130, implemented as the via rim 138 having the via hole 131, and the first coupling feature 102, implemented as the via post 103, with the conductive adhesive cap 128. The first coupling feature 102 provides additional surface area because of the non-flat shape of the first coupling feature 102. The second coupling feature 130 provides increased surface area because of the complimentary shape of the second coupling feature 130.

It has been discovered that the present invention provides improved joint strength and horizontal stability because of the interlock structure formed by the first coupling feature 102 inserted into the second coupling feature 130. The first coupling feature 102 and the second coupling feature 130 form an interlocking structure when stacked together. The interlocking structure can inhibit lateral motion between the first coupling feature 102 and the second coupling feature 130.

It has been discovered that the present invention provides improved joint quality and more reliable alignment between two of the through silicon via 110. The first coupling feature 102 has a smaller diameter than the second coupling feature 130 allowing the first coupling feature 102 to act as a guide and self-align inside the second coupling feature 130.

It has been discovered that the present invention provides higher vertical density of the integrated circuit packaging system 100. The first coupling feature 102 can attached inside the second coupling feature 130 reducing the vertical separation required to connect two of the integrated circuit packaging system 100.

Figure 4:
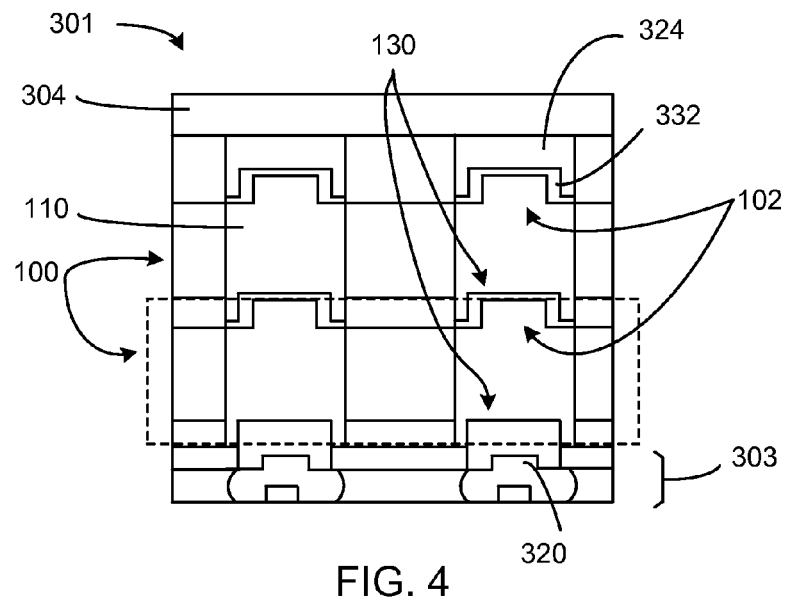
FIG. 4 is a detailed cross-sectional view of the multi-chip package of the integrated circuit packaging system.

Referring now to FIG. 4, therein is shown a detailed cross-sectional view of the multi-chip package 301 of the integrated circuit packaging system 100. The multi-chip package 301 can include the top integrated circuit package 304 mounted over the first of the integrated circuit packaging system 100 and the second of the integrated circuit packaging system 100 mounted over the external substrate 303. The multi-chip package 301 can include the first of the integrated circuit packaging system 100 mounted over the second of the integrated circuit packaging system 100. The detailed cross-sectional view of the multi-chip package 301 represents the area defined by the dashed rectangle in FIG. 3.

The multi-chip package 301 can include the top integrated circuit package 304 mounted over the first of the integrated circuit packaging system 100. The top integrated circuit package 304 can include the third coupling feature 324 mounted on or over the second coupling feature 130 of first of the integrated circuit packaging system 100. The first coupling feature 102 is positioned within the structure of the third coupling feature 324. The third coupling feature 324 is attached to the first coupling feature 102 with the conductive adhesive layer 332 of FIG. 3. The third coupling feature 324 can electrically connect the first coupling feature 102, the through silicon via 110, and the second coupling feature 130.

The multi-chip package 301 can include the second coupling feature 130 of the first of the integrated circuit packaging system 100 mounted on the first coupling feature 102 of the second of the integrated circuit packaging system 100. The first coupling feature 102 is attached to the second coupling feature 130 with the conductive adhesive cap 128 of FIG. 1 positioned in the second coupling feature 130. The first coupling feature 102 and the second coupling feature 130 can electrically connect the through silicon via 110 of the first of the integrated circuit packaging system 100 and the through silicon via of the second of the integrated circuit packaging system 100.

The multi-chip package 301 can include the second coupling feature 130 of the through silicon via 110 of the second of the integrated circuit packaging system 100 mounted on the top mounting pad 320 of the external substrate 303. The second coupling feature 130 and the top mounting pad 320 can be attached by the conductive adhesive layer 332. The second coupling feature 130 and the top mounting pad 320 can electrically connect the through silicon via 110 of the second of the integrated circuit packaging system 100, the top mounting pad 320, the vertical substrate interconnect 318 of FIG. 3, the bottom mounting pad 316 of FIG. 3, and the external interconnect 322 of FIG. 3.

Figure 5:
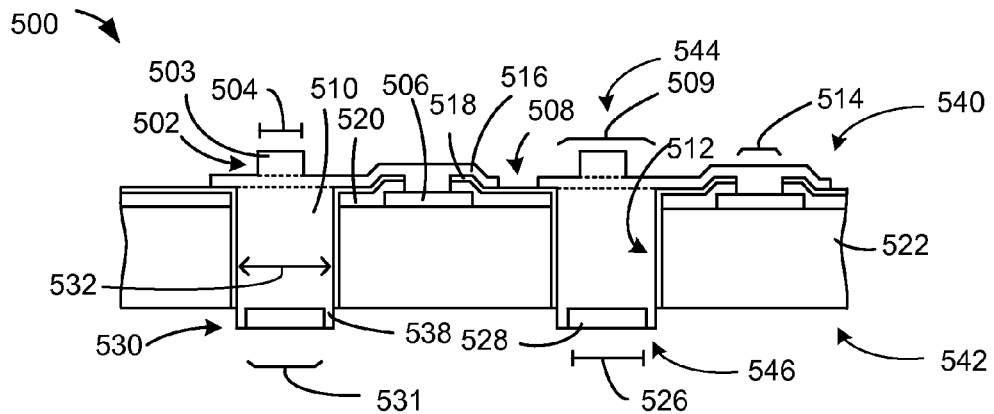
FIG. 5 is a cross-sectional view of an integrated circuit packaging system in a second embodiment of the present invention.

Referring now to FIG. 5, therein is shown a cross-sectional view of an integrated circuit packaging system 500 in a second embodiment of the present invention. The integrated circuit packaging system 500 can include a through silicon via 510 in a wafer substrate 522.

The integrated circuit packaging system 500 can include the through silicon via 510 extending through the wafer substrate 522. The through silicon via 510 is an electrically conductive element for transferring electrical signals from one side of the wafer substrate 522 to the opposite side. The through silicon via 510 can be formed from a conductive material, such as copper, gold, nickel, tin, an alloy, or a combination thereof.

The integrated circuit packaging system 500 can include a via recess 509. The via recess 509 is an opening extending through the wafer substrate 522. The through silicon via 510 is formed in the via recess 509.

The through silicon via 510 can have a via width 532. The via width 532 is the horizontal distance from one side of the through silicon via 510 to an opposite side defined by a line passing through the geometric center of the through silicon via 510.

The integrated circuit packaging system 500 can include an active side 540 and a back side 542. The active side 540 is the side having active circuitry, such as integrated transistor circuits, formed on the wafer substrate 522. The back side 542 is on the opposite side from the active side 540.

The wafer substrate 522 is a structure for supporting and connecting an integrated circuit including providing electrical connection through the structure. The wafer substrate 522 can be an integrated circuit, silicon wafer, a gallium-arsenide structure, a silicon on insulator structure, or a combination thereof. The wafer substrate 522 can include electrical circuitry such as an integrated circuit on the active side 540.

The through silicon via 510 can include a first coupling feature 502 formed on a top side 544 of the through silicon via 510 and a second coupling feature 530 formed on a bottom side 546 of the through silicon via 510. The first coupling feature 502 can be implemented as a via post 503, a via rim 538 having a via hole 531, a protrusion, an opening, or a combination thereof. The second coupling feature 530 can be implemented as the via post 503, the via rim 538 having the via hole 531, a protrusion, an opening, or a combination thereof. The through silicon via 510 can be implemented having the first coupling feature 502 different from the second coupling feature 530 or the first coupling feature 502 being the same as the second coupling feature 530.

The first coupling feature 502 is an electrically conductive structure for forming a connection with the second coupling feature 530 of an external element. The second coupling features 530 is an electrically conductive structure for forming a connection with the first coupling feature 502 of an external element.

The top side 544 of the through silicon via 510 is relative to a horizontal plane through the center of the integrated circuit packaging system 500. The top side 544 is on the same side as the active side 540 of the wafer substrate 522. The bottom side 546 of the through silicon via 510 is on the same side as the back side 542 of the wafer substrate 522.

The first coupling feature 502 can be cylindrical shaped, although it is understood that the first coupling feature 502 can have other shapes including round, square, polygonal, or a combination thereof. The first coupling feature 502 has a first coupling feature diameter 504. The first coupling feature diameter 504 is the horizontal distance across the first coupling feature 502 as measured by a line (not show) passing through the geometric center of the first coupling feature 502. The first coupling feature diameter 504 is smaller than the via width 532.

The second coupling feature 530 can have a complementary shape for accommodating the first coupling feature 502 of an additional unit of the integrated circuit packaging system 500. The second coupling feature 530 can be shaped cylindrically, round, square, polygonal, or a combination thereof.

The second coupling feature 530 has a second coupling feature diameter 526. The second coupling feature diameter 526 is the distance from one side of the second coupling feature 530 to the other side as measured by a line (not shown) drawn through the geometric center of the second coupling feature 530. The second coupling feature diameter 526 can be larger than the first coupling feature diameter 504. For example, the via hole 531 has a complementary shape and a larger diameter for accommodating the via post 503.

In another example, the second coupling feature 530 can include a via rim 538 having a via hole 531. The via rim 538 can be an electrically conductive, ring shaped structure around the circumference of the bottom side 546 of the through silicon via 510. The via rim 538 can have the same diameter as the via width 532.

The first coupling feature 502 can form an interlocking connection with the second coupling feature 530 of another of the integrated circuit packaging system 500. Interlocking is defined as forming a connection preventing relative motion between elements of the connection.

The first coupling feature 502 and the second coupling feature 530 are electrically conductive elements that can be used with the through silicon via 510 to transfer electrical signals from the active side 540 of the integrated circuit packaging system 500 to the back side 542. The first coupling feature 502 and the second coupling feature 530 can be formed from a conductive material, such as copper, gold, nickel, tin, an alloy, or a combination thereof.

The integrated circuit packaging system 500 can include a contact 506 electrically connected to the through silicon via 510. The contact 506 can be directly on or over the active side 540 of the wafer substrate 522. The contact 506 is a conductive element for forming electrical connections to an integrated circuit (not shown) in the wafer substrate 522. The contact 506 can be formed from a conductive material, such as copper, gold, nickel, tin, an alloy, or a combination thereof.

The integrated circuit packaging system 500 can include a first insulation layer 520 formed directly on or over the wafer substrate 522 and the contact 506. The first insulation layer 520 can be formed from an electrically insulating material such as a polymer, polyimide, an oxide, or a combination thereof. The first insulation layer 520 is for electrically insulating elements from other elements.

The integrated circuit packaging system 500 can include a second insulation layer 518 directly on or over the first insulation layer 520, the via recess 509, and the wafer substrate 522. The second insulation layer 518 is directly on a via recess sidewall 512 between the wafer substrate 522 and the through silicon via 510. The second insulation layer 518 can be formed from an electrically insulating material such as a polymer, polyimide, an oxide, or a combination thereof. The second insulation layer 518 is for electrically insulating elements from other elements.

The integrated circuit packaging system 500 can include a metal layer 516 directly on or over the second insulation layer 518, the through silicon via 510, and the contact 506. The metal layer 516 is an electrically conductive structure for conducting electric signals. The metal layer 516 can be formed from a conductive material such as copper, gold, nickel, an alloy, or a combination thereof.

The metal layer 516 can form the through silicon via 510. The metal layer 516 can be formed directly on or over the second insulation layer 518 in the via recess 509 to form the through silicon via 510. The metal layer 516 can electrically connect the contact 506, the through silicon via 510, the first coupling feature 502, and the second coupling feature 530.

The metal layer 516 can include an inter-via gap 508. The inter-via gap 508 is an opening in the metal layer 516 exposing a portion of the second insulation layer 518 between the contact 506 and the through silicon via 510. The inter-via gap 508 can surround pairs of the through silicon via 510 and the contact 506 that are coupled electrically by the metal layer 516.

The integrated circuit packaging system 500 can include a contact opening 514 over the contact 506 through the second insulation layer 518 and the first insulation layer 520. The metal layer 516 can fill the contact opening 514 electrically connecting the contact 506, the metal layer 516, and the through silicon via 510.

The integrated circuit packaging system 500 can include a conductive adhesive cap 528, such as a solder cap, on the second coupling feature 530. The conductive adhesive cap 528 can be formed from a conductive adhesive material, such as solder, solder paste, conductive resin, or a combination thereof.

In an illustrative example, the first coupling feature 502 can be implemented as the via post 503. The via post 503 can range between 10 and 20 μm in height and between 10 to 20 μm in diameter.

In another illustrative example, the second coupling feature 530 can be implemented as the via rim 538 having the via hole 531. The via hole 531 can range between 20 and 40 μm in depth and between 20 to 40 μm in interior diameter. The via rim 538 can range between 10 and 20 μm in wall thickness. The via width 532 of the through silicon via 110 can range between 40 and 80 μm.

It has been discovered that the present invention increases solder joint reliability by preventing solder bridges forming between two of the through silicon via 510. Forming the metal layer 516 around the first coupling feature 502 provides a conductive overflow area for the material displaced by inserting the first coupling feature 502 into the second coupling feature 530.

It has been discovered that the present invention provides improved functionality by forming the metal layer 516 connecting the contact 506, the through silicon via 510, the first coupling feature 502, and the second coupling feature 530. The metal layer 516 can be electrically connected with the through silicon via 510 to provide electrical conductivity from the contact 506 to the back side 542 of the integrated circuit packaging system 500 as well as the active side of the integrated circuit packaging system 500. The through silicon via 510 can provide vertical connectivity from the electrical circuitry coupled to the contact 506 to external elements coupled to the first coupling feature 502 or the second coupling feature 530.

It has been discovered that the present invention provides improved joint strength because of the increased surface area of the connection between the first coupling feature 502 and the second coupling feature 530 as compared to a flat surface. The first coupling feature 502 provides additional surface area because of the non-flat shape of the first coupling feature 502. The second coupling feature 530 provides increased surface area because of the complimentary shape of the second coupling feature 530.

It has been discovered that the present invention provides improved joint strength and horizontal stability because of the interlock structure formed by the first coupling feature 502 inserted into the second coupling feature 530. The first coupling feature 502 and the second coupling feature 530 form an interlocking structure when stacked together. The interlocking structure can inhibit lateral motion between the first coupling feature 502 and the second coupling feature 530.

It has been discovered that the present invention provides improved joint quality and more reliable alignment between two of the through silicon via 510. The first coupling feature 502 has a smaller diameter than the second coupling feature 530 allowing the first coupling feature 502 to act as a guide and fit inside the second coupling feature 530.

Figure 6A:
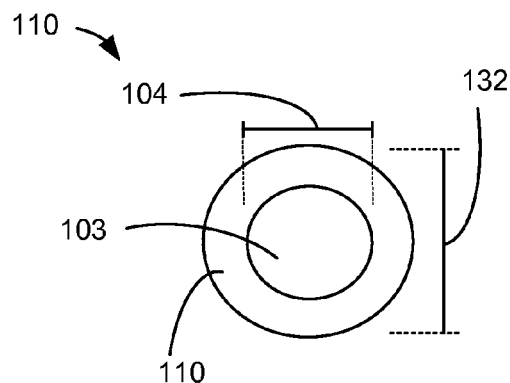
FIG. 6A is a top view of the through silicon via.

Referring now to FIG. 6A, therein is shown a top view of the through silicon via 110. The through silicon via 110 can include first coupling feature 102 of FIG. 1, implemented as the via post 103. The via post 103 is on the top side 144 of FIG. 1 of through silicon via 110. The via post 103 can include the first coupling feature diameter 104. The first coupling feature diameter 104 can be smaller than the via width 132. The first coupling feature diameter 104 can be smaller than the second coupling feature diameter 126 of FIG. 1.

Figure 6B:
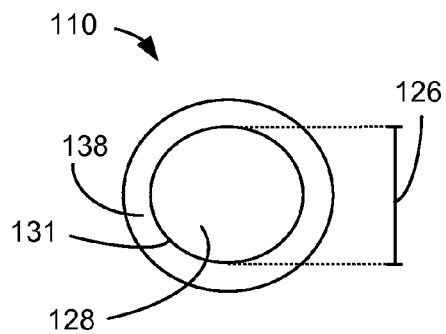
FIG. 6B is a bottom view of the through silicon via.

Referring now to FIG. 6B, therein is shown a bottom view of the through silicon via 110. The through silicon via 110 can include the second coupling feature 130 of FIG. 1 implemented as the via rim 138 having the via hole 131.

The second coupling feature 130 is positioned on the bottom side 146 of FIG. 1 of the through silicon via 110. The second coupling feature 130 includes the second coupling feature diameter 126.

The via rim 138 is positioned on the back side 142 of FIG. 1 of the wafer substrate 122 of FIG. 1. The via rim 138 can be a stepped lip extending from the through silicon via 110.

The through silicon via 110 can include the conductive adhesive cap 128 formed in and directly on the second coupling feature 130. The conductive adhesive cap 128 can completely fill the second coupling feature 130.

Figure 7:
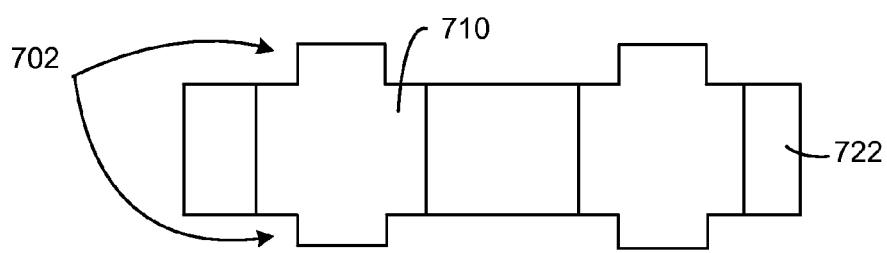
FIG. 7 is a first example of the through silicon via.

Referring now to FIG. 7, therein is shown a first example of a through silicon via 710. The through silicon via 710 extends through a wafer substrate 722. The through silicon via 710 can expose one of a first coupling feature 702, implemented as the via post 103 of FIG. 1, on one side of the wafer substrate 722 and expose another of the first coupling feature 702 on the opposite side.

Figure 8:
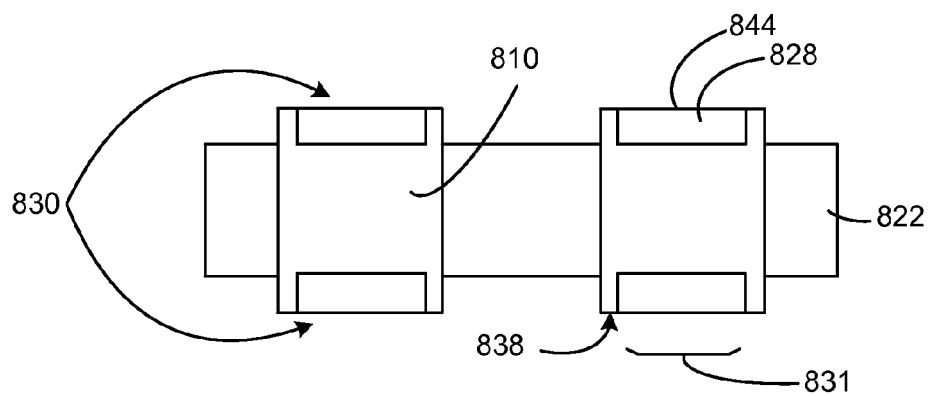
FIG. 8 is a second example of the through silicon via.

Referring now to FIG. 8, therein is shown a second example of a through silicon via 810. The through silicon via 810 can extend through a wafer substrate 822. The through silicon via 810 can expose a second coupling feature 830, implemented as a via rim 838 having a via hole 831, and a conductive adhesive cap 828 on one side of the wafer substrate 822 and another of the second coupling feature 830 and another of the conductive adhesive cap 828 on the opposite side.

The through silicon via 810 can include the conductive adhesive cap 828 formed in and directly on the second coupling feature 830. The conductive adhesive cap 828 can include a conductive adhesive cap outer surface 844 exposed on the side of the conductive adhesive cap furthest away from the wafer substrate 822.

In an illustrative example, the conductive adhesive cap 828 can attach the second coupling feature 830 to the first coupling feature 102 of FIG. 1 of the integrated circuit packaging system 100 of FIG. 1. The conductive adhesive cap 828 can be formed in the second coupling feature 830. The conductive adhesive cap 828 can completely fill the second coupling feature 830.

Figure 9:
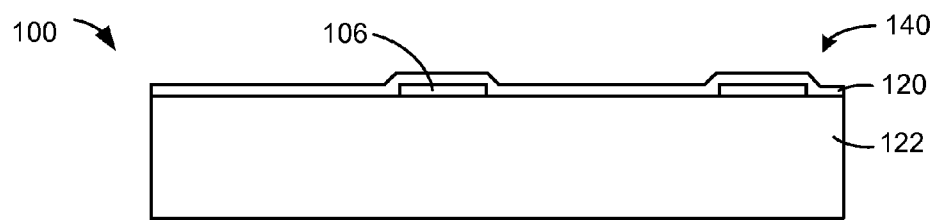
FIG. 9 is the integrated circuit packaging system in an incoming wafer phase of manufacturing.

Referring now to FIG. 9, therein is shown the integrated circuit packaging system 100 in an incoming wafer phase of manufacturing. The integrated circuit packaging system 100 can include the contact 106 mounted over the wafer substrate 122 with the first insulation layer 120 over the contact 106 and the wafer substrate 122.

The contact 106 is on the active side 140 of the wafer substrate 122. The contact 106 can be attached to the wafer substrate 122 with an adhesive material (not shown).

The first insulation layer 120 is formed directly on or over the contact 106 and the wafer substrate 122. The first insulation layer 120 completely covers the contact 106.

Figure 10:
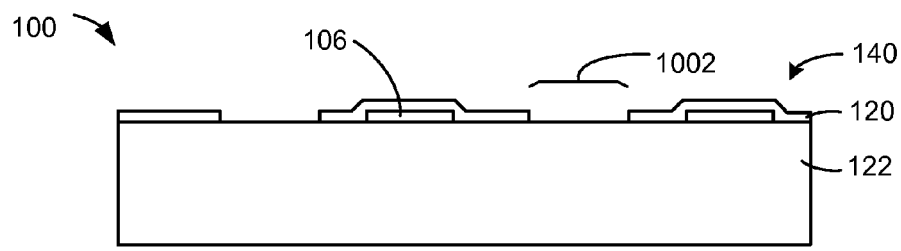
FIG. 10 is the structure of FIG. 9 in an insulation patterning phase of manufacturing.

Referring now to FIG. 10, therein is shown the structure of FIG. 9 in an insulation patterning phase of manufacturing. The integrated circuit packaging system 100 can include the contact 106 mounted on the wafer substrate 122 with the first insulation layer 120 over the contact 106 and a portion of the wafer substrate 122.

The first insulation layer 120 can be patterned to remove a portion of the first insulation layer 120 and expose the wafer substrate 122 in a first insulation opening 1002 on the active side 140. Patterning is defined as removing a portion of a surface not protected by a pattern mask (not shown). Patterning can be performed in a variety of methods. For example, patterning can include laser etching, a wet etch process, a dry etch process, grinding, or a combination thereof. The patterning process can include forming the pattern mask over areas of the surface to be protected.

The patterning process can expose the first insulation opening 1002 adjacent to the contact 106. The first insulation opening 1002 can be between one of the contact 106 and another of the contact 106. The first insulation opening 1002 can be for defining the location of the through silicon via 110 of FIG. 1.

Figure 11:
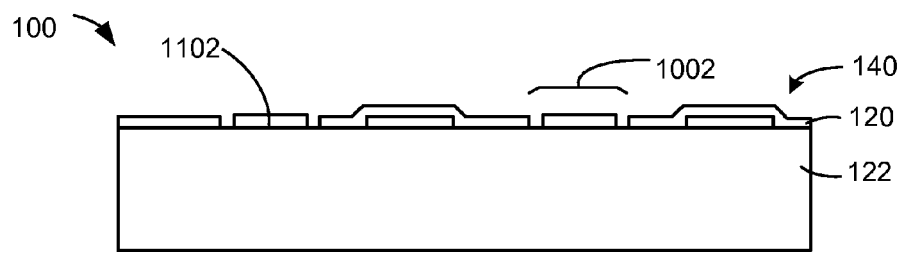
FIG. 11 is the structure of FIG. 10 in a deposit mask phase of manufacturing.

Referring now to FIG. 11, therein is shown the structure of FIG. 10 in a deposit mask phase of manufacturing. The integrated circuit packaging system 100 can include a deposit mask 1102 formed directly on the wafer substrate 122.

The deposit mask 1102 is a structure formed on the wafer substrate 122 for protecting the underlying substrate material. The deposit mask 1102 can be formed from an etch resistant material such as a polymer, oxide, or a combination thereof. The deposit mask 1102 is for defining the location of the through silicon via 110 of FIG. 1 and the via rim 138 of FIG. 1.

The deposit mask 1102 is formed on the active side 140 of the wafer substrate 122 and within the first insulation opening 1002. The deposit mask 1102 has a diameter smaller than the diameter of the first insulation opening 1002. The deposit mask 1102 is surrounded by an exposed area of the wafer substrate 122. The deposit mask 1102 is surrounded horizontally by the first insulation layer 120.

The deposit mask 1102 can be formed directly on the wafer substrate 122 by a variety of methods. For example, the deposit mask 1102 can be formed by depositing, plating, sputtering, spraying, painting, rolling, laminating, or a combination thereof.

Figure 12:
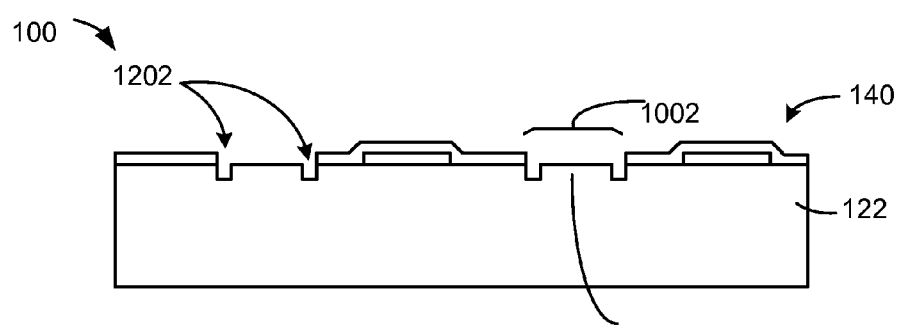
FIG. 12 is the structure of FIG. 11 in a first via etching phase of manufacturing.

Referring now to FIG. 12, therein is shown the structure of FIG. 11 in a first via etching phase of manufacturing. The integrated circuit packaging system 100 can include the first insulation opening 1002 exposing the wafer substrate 122 having an outer recess 1202 formed in the wafer substrate 122.

The outer recess 1202 is a ring-shaped opening formed in the wafer substrate along a perimeter of the deposit mask 1102 of FIG. 11. The outer recess 1202 can be formed by etching portions of the active side 140 of the wafer substrate 122 within the first insulation opening 1002 and unprotected by the deposit mask 1102. The wafer substrate 122 can be etched in a variety of methods including dry etch, wet etch, ion-etching, or a combination thereof.

The outer recess 1202 can be formed inside the perimeter of the first insulation opening 1002. The outer recess 1202 can form a ring-shaped opening in the wafer substrate 122 having a center plug 1204 formed directly under the deposit mask 1102.

Figure 13:
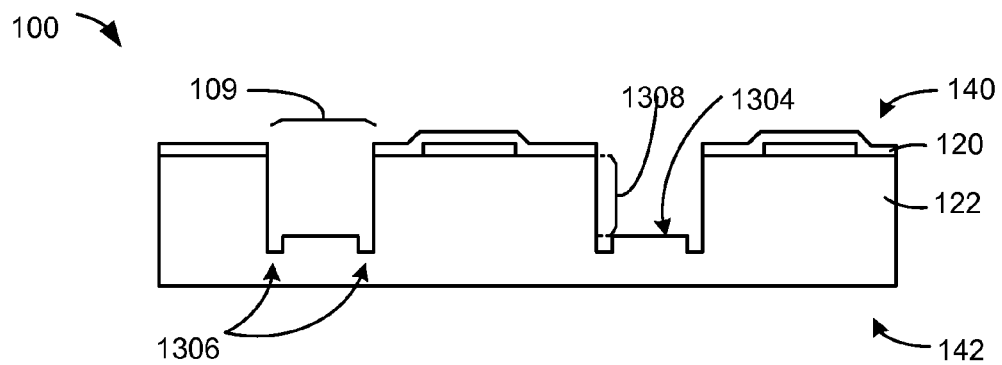
FIG. 13 is the structure of FIG. 12 in a second via etching phase of manufacturing.

Referring now to FIG. 13, therein is shown the structure of FIG. 12 in a second via etching phase of manufacturing. The integrated circuit packaging system 100 can include the wafer substrate 122 having the via recess 109 formed within the first insulation opening 1002 of FIG. 10.

The via recess 109 can be formed by etching the wafer substrate 122 within the first insulation opening 1002 in the first insulation layer 120. The wafer substrate 122 can be etched in a variety of methods including dry etch, wet etch, laser etching, ion-etching, or a combination thereof.

The via recess 109 can be formed having a via depth 1308. The via depth 1308 is the distance between the top of a via hole plug 1304 and the surface of the wafer substrate 122 on the active side 140.

The via recess 109 can include a via rim recess 1306. The via rim recess 1306 is a ring shaped opening in the via recess 109 extending toward the back side 142 of the wafer substrate 122. The via rim recess 1306 can define the shape of the via rim 138 of FIG. 1.

The via rim recess 1306 is formed around the via hole plug 1304. The via hole plug 1304 is a structure formed in the wafer substrate 122 by etching the via rim recess 1306.

The via recess 109 can be formed in a variety of ways. For example, the via recess 109 can be formed using a uniform etching process to preserve the surface features of the via recess 109 including the outer recess 1202 of FIG. 12. The outer recess 1202 can be uniformly etched with the via recess 109 to form the via rim recess 1306.

In another example, the via recess 109 can be formed in a multi-stage process whereby the via recess 109 is etched to the via depth 1308. A second deposit mask (not shown) can be formed in the via recess 109 to protect the via hole plug 1304. The via recess 109 can be etched to form the via rim recess 1306 and the via hole plug 1304.

Figure 14:
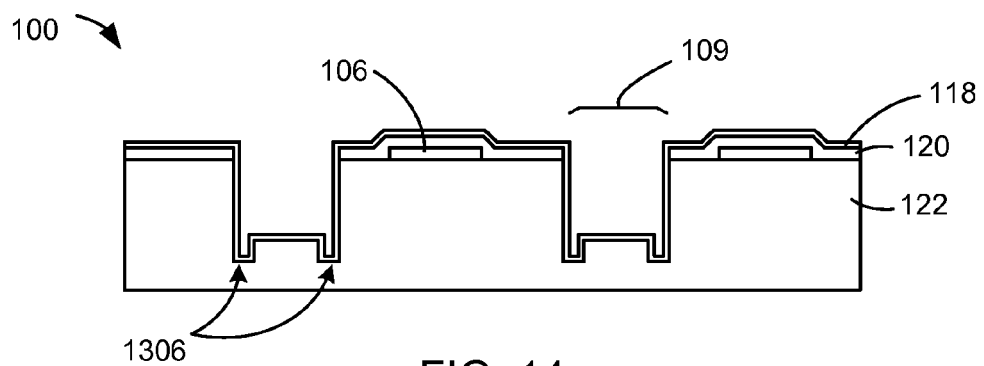
FIG. 14 is the structure of FIG. 13 in an insulation application phase of manufacturing.

Referring now to FIG. 14, therein is shown the structure of FIG. 13 in an insulation application phase of manufacturing. The integrated circuit packaging system 100 can include the second insulation layer 118 formed over the via recess 109 and the first insulation layer 120.

The second insulation layer 118 can be formed directly on the wafer substrate 122 in the via recess 109. The second insulation layer 118 can be formed directly on the surface of the via rim recess 1306. The second insulation layer 118 can be formed directly on the first insulation layer 120 and over the contact 106.

The second insulation layer 118 can be formed in a variety of ways. For example, the second insulation layer 118 can be formed by depositing, plating, sputtering, spraying, painting, rolling, laminating, or a combination thereof.

Figure 15:
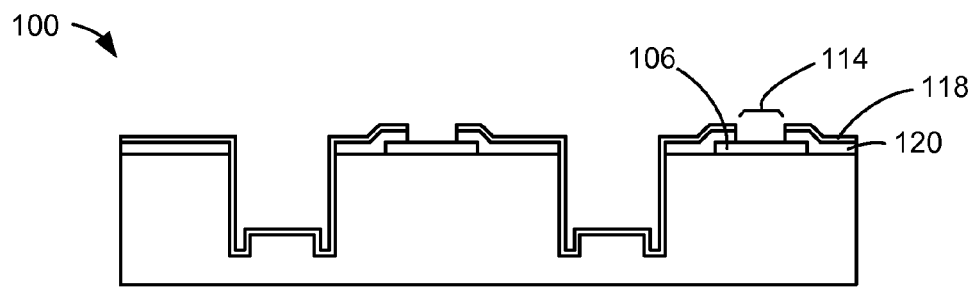
FIG. 15 is the structure of FIG. 14 in a contact patterning phase of manufacturing.

Referring now to FIG. 15, therein is shown the structure of FIG. 14 in a contact patterning phase of manufacturing. The integrated circuit packaging system 100 can include the contact 106 exposed by the contact opening 114 formed over the contact 106 in the second insulation layer 118 and the first insulation layer 120.

The first insulation layer 120 and the second insulation layer 118 can be patterned to form the contact opening 114 to expose the contact 106. Patterning is defined as removing a portion of a surface not protected by a pattern mask (not shown). Patterning can be performed in a variety of methods. For example, patterning can include laser etching, a wet etch process, a dry etch process, grinding, or a combination thereof. The patterning process can include forming the pattern mask exposing the location of the contact opening 114.

Figure 16:
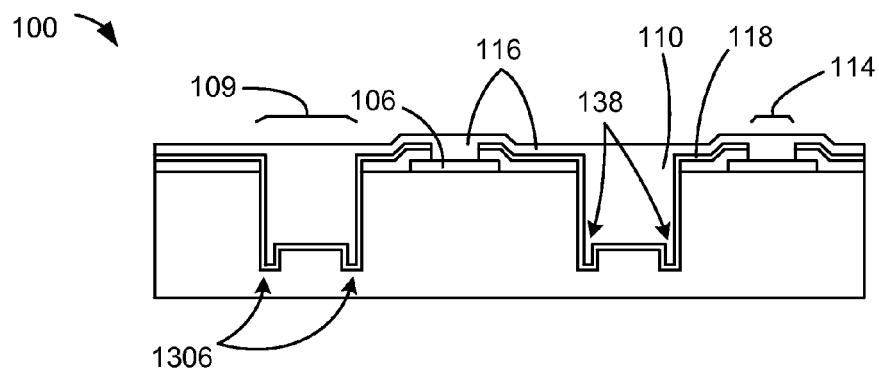
FIG. 16 is the structure of FIG. 15 in a first plating phase of manufacturing.

Referring now to FIG. 16, therein is shown the structure of FIG. 15 in a first plating phase of manufacturing. The integrated circuit packaging system 100 can include the metal layer 116 formed over the second insulation layer 118 and the contact 106.

The metal layer 116 can be formed in a variety of ways. For example, the metal layer 116 can be formed by sputtering, electroplating, electroless plating, depositing, or a combination thereof.

The through silicon via 110 and the via rim 138 can be formed by plating the metal layer 116 over the second insulation layer 118 within the via recess 109 and the via rim recess 1306. The metal layer 116 can completely fill the via recess 109 and the via rim recess 1306.

The metal layer 116 can be plated directly on the contact 106 within the contact opening 114. The metal layer 116 can be plated directly on the second insulation layer 118 to electrically connect the through silicon via 110 and the contact 106.

For example, the through silicon via 110 can be formed by plating the second insulation layer 118 in the via recess 109 until the through silicon via 110 completely fills the via recess 109. Then metal layer 116 can then be plated directly on or over the through system via 110, the contact 106, and the exposed portions of the second insulation layer 118.

Figure 17:
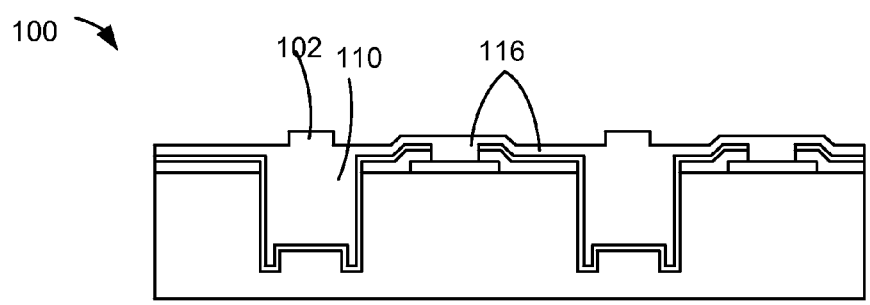
FIG. 17 is the structure of FIG. 16 in a second plating phase of manufacturing.

Referring now to FIG. 17, therein is shown the structure of FIG. 16 in a second plating phase of manufacturing. The integrated circuit packaging system 100 can include the first coupling feature 102, implemented as the via post 103 of FIG. 1, formed over the through silicon via 110 and the metal layer 116. The first coupling feature 102 forms an electrical connection with the through silicon via 110 and the first metal layer 116.

The first coupling feature 102 can be formed directly over the through silicon via 110 and directly on the metal layer 116. The first coupling feature 102 can be formed in a variety of ways. For example, the first coupling feature 102 can be formed by depositing a mask (not shown) over the metal layer 116 with an opening defining the location of the first coupling feature 102 and plating metal over the mask. In another example, electrically conductive material can be sputtered over the mask to form the first coupling feature 102.

Figure 18:
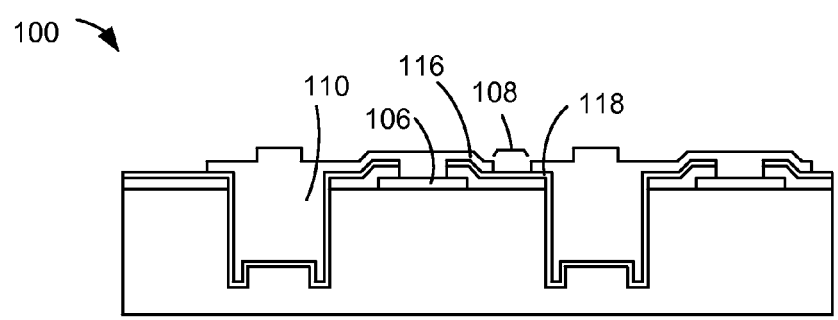
FIG. 18 is the structure of FIG. 17 in an inter-via gap patterning phase of manufacturing.

Referring now to FIG. 18, therein is shown the structure of FIG. 17 in an inter-via gap patterning phase of manufacturing.

The integrated circuit packaging system 100 can include the inter-via gap 108 exposing the second insulation layer 118.

The metal layer 116 can be patterned to form the inter-via gap 108 between pairs of the through silicon via 110 and the contact 106. Patterning is defined as removing a portion of a surface not protected by a pattern mask (not shown). Patterning can be performed in a variety of methods. For example, patterning can include laser etching, a wet etch process, a dry etch process, grinding, or a combination thereof. Patterning can include forming a pattern mask for defining the location of the inter-via gap 108. After the inter-via gap 108 has been formed, the pattern mask can be removed.

Figure 19:
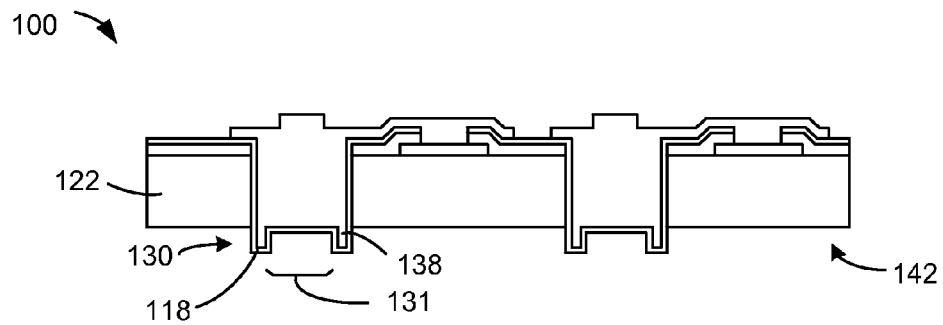
FIG. 19 is the structure of FIG. 18 in a substrate etching phase of manufacturing.

Referring now to FIG. 19, therein is shown the structure of FIG. 18 in a substrate etching phase of manufacturing. The integrated circuit packaging system 100 can include exposing the second insulation layer 118 covering the second coupling feature 130.

The back side 142 of the wafer substrate 122 can be etched to expose the second insulation layer 118 covering the second coupling feature 130 implemented as the via rim 138 having the via hole 131. Etching can include a wet etch process, dry etch process, laser etching, or a combination thereof.

The surface of the back side 142 of the wafer substrate 122 can be etched to be coplanar with the interface between the horizontal surface of the second coupling feature 130 and the surface of the second insulation layer 118 in the second coupling feature 130 and facing the back side 142.

Figure 20:
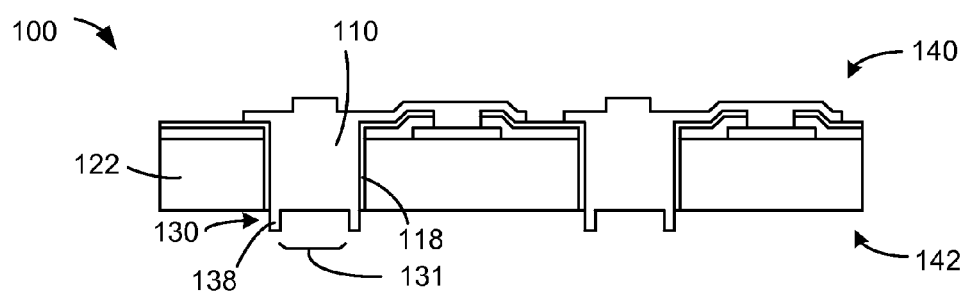
FIG. 20 is the structure of FIG. 19 in an insulation etching phase of manufacturing.

Referring now to FIG. 20, therein is shown the structure of FIG. 19 in an insulation etching phase of manufacturing. The integrated circuit packaging system 100 can include the second coupling feature 130 exposed from the second insulation layer 118 on the back side 142 of the wafer substrate 122.

The second insulation layer 118 can be etched to expose the second coupling feature 130 implemented as the via rim 138 having the via hole 131. Etching can be performed in a variety of ways. For example, the second insulation layer 118 can be etched using a dry etch, a wet etch, laser etch, or a combination thereof. The through silicon via 110 including the second coupling feature 130 can form an electrically conductive path from the back side 142 of the wafer substrate 122 to the active side 140 of the wafer substrate 122.

Figure 21:
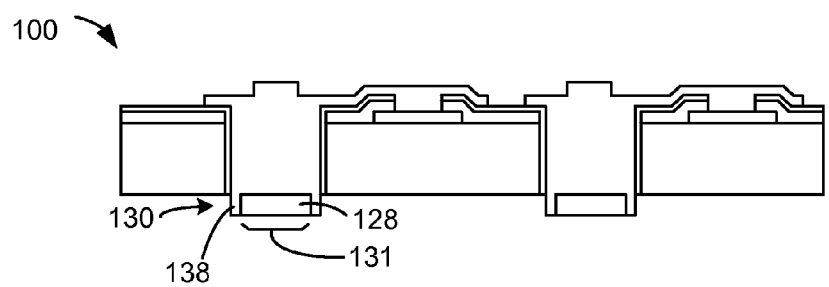
FIG. 21 is the structure of FIG. 20 in a deposit conductive adhesive cap phase of manufacturing.

Referring now to FIG. 21, therein is shown the structure of FIG. 20 in a deposit conductive adhesive cap phase of manufacturing. The integrated circuit packaging system 100 can include the conductive adhesive cap 128 formed in the second coupling feature 130 implemented as the via rim 138 having the via hole 131. The conductive adhesive cap 128 can be formed directly on and in the second coupling feature 130 by depositing a conductive adhesive material in the second coupling feature 130. The conductive adhesive cap 128 completely fills the second coupling feature 130.

Figure 22:
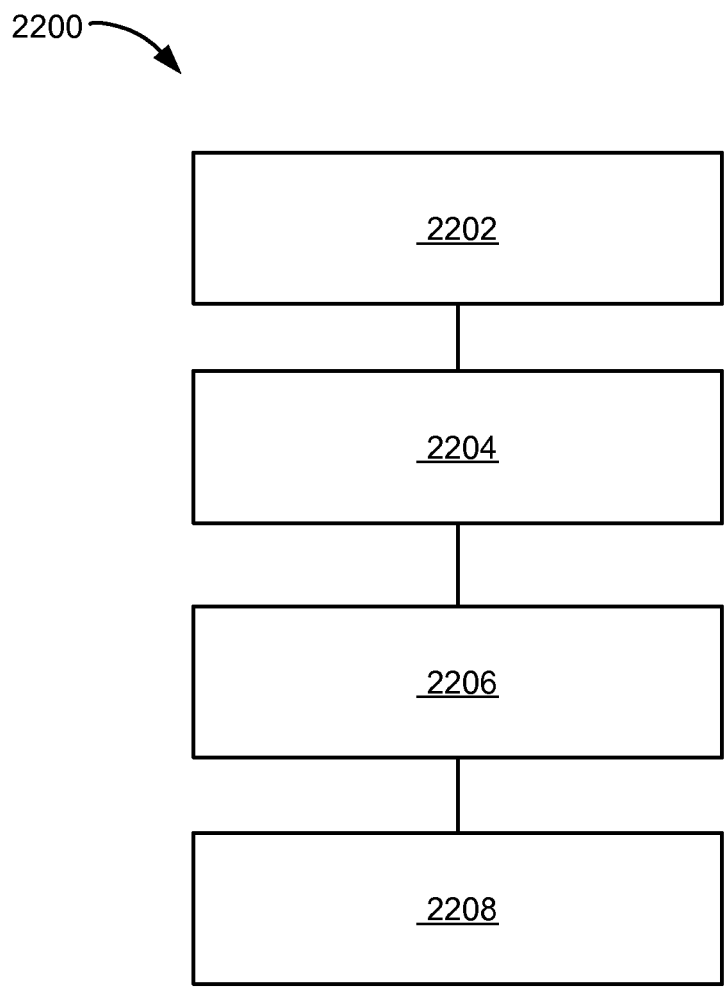
FIG. 22 is a flow chart of a method of manufacture of the integrated circuit packaging system in a further embodiment of the present invention.

Referring now to FIG. 22, therein is shown a flow chart of a method 2200 of manufacture of the integrated circuit packaging system in a further embodiment of the present invention. The method 2200 includes: providing a wafer substrate having an active side containing a contact in a block 2202; forming a through silicon via extending through the wafer substrate electrically connected to the contact having a via width in a block 2204; forming a first coupling feature extending from a top side of the through silicon via in a block 2206; and forming a second coupling feature on the side of the through silicon via opposite the first coupling feature in a block 2208.

It has been discovered that the present invention thus has numerous aspects.

A principle aspect that has been unexpectedly discovered is that the present invention can provide a simplified mechanism for providing coupling features.

Another aspect is the present invention utilizes only standard package assembly processes, yet is extremely reliable. There is minimal thickness added to the finished package and no additional horizontal space required to implement the present invention.

Yet another important aspect of the present invention is that it valuably supports and services the historical trend of reducing costs, simplifying systems, and increasing performance. These and other valuable aspects of the present invention consequently further the state of the technology to at least the next level.

Thus, it has been discovered that the integrated circuit packaging system of the present invention furnishes important and heretofore unknown and unavailable solutions, capabilities, and functional aspects for providing coupling features for integrated circuit packages. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems/fully compatible with conventional manufacturing methods or processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a wafer substrate having an active side containing a contact;
   forming a through silicon via extending through the wafer substrate electrically coupled to the contact having a via width;
   forming a first coupling feature, on the through silicon via, extending from the active side;
   forming a second coupling feature on the side of the through silicon via opposite the first coupling feature; and
   forming a conductive adhesive cap directly on the second coupling feature, wherein forming the first coupling feature includes the first coupling feature having a first coupling feature diameter smaller than a second coupling feature diameter.

2. The method as claimed in claim 1 wherein forming the first coupling feature includes forming a via post or a via hole.

3. The method as claimed in claim 1 wherein forming the second coupling feature includes forming a via post or a via hole.

4. The method as claimed in claim 1 further comprising:
   forming a first insulation layer directly on the contact and the wafer substrate;
   forming a second insulation layer directly on the first insulation layer;
   forming a contact opening through the first insulation layer and the second insulation layer exposing the contact; and forming a metal layer directly on the second insulation layer and the contact.

5. The method as claimed in claim 4 wherein forming the second coupling feature includes removing a portion of the second insulation layer covering the second coupling feature.

6. The method as claimed in claim 1 further comprising:
forming a via recess by etching the wafer substrate; and
forming a via rim recess along an outer circumference of the via recess with a deposit mask having a diameter less than a via width.

7. The method as claimed in claim 6 wherein forming the second coupling feature includes removing a portion of the wafer substrate for exposing the second coupling feature.

8. The method as claimed in claim 1 wherein forming the second coupling feature includes forming a barrier layer directly on the second coupling feature for preventing diffusion between the through silicon via and the conductive adhesive cap.

9. An integrated circuit packaging system comprising:
a wafer substrate having an active side;
a contact formed directly on the wafer substrate;
a through silicon via extending through the wafer substrate electrically connected to the contact and having a via width;
a first coupling feature extending from a top side of the through silicon via; and
a second coupling feature on the side of the through silicon via opposite the first coupling feature;
a conductive adhesive cap directly on the second coupling feature;
the first coupling feature includes a first coupling feature diameter; and
the second coupling feature includes a second coupling feature diameter larger than the first coupling feature diameter.

10. The system as claimed in claim 9 wherein the first coupling feature includes a via post or a via hole.

11. The system as claimed in claim 9 wherein the second coupling feature is a via post or a via hole.

12. The system as claimed in claim 9 further comprising:
a first insulation layer directly on the contact and the wafer substrate having a contact opening over the contact;
a second insulation layer directly on the first insulation layer having a contact opening over the contact; and
a metal layer directly on the second insulation layer and the contact.

13. The system as claimed in claim 12 wherein the second coupling feature is exposed from the second insulation layer.

14. The system as claimed in claim 9 wherein the wafer substrate includes:
the wafer substrate having a via recess extending through the wafer substrate; and
the wafer substrate having a via rim recess along an outer circumference of the via recess.

15. The system as claimed in claim 14 wherein the second coupling feature is exposed from the wafer substrate.

16. An integrated circuit packaging system comprising:
a wafer substrate having an active side;
a contact formed directly on the wafer substrate;
a through silicon via extending through the wafer substrate electrically connected to the contact and having a via width;
a first coupling feature extending from a top side of the through silicon via; and
a second coupling feature on the side of the through silicon via opposite the first coupling feature; and
a conductive adhesive cap directly on the second coupling feature, wherein the second coupling feature includes a barrier layer directly on the second coupling feature for preventing diffusion between the through silicon via and the conductive adhesive cap.

17. The system as claimed in claim 16 wherein the first coupling feature includes a via post or a via hole.

18. The system as claimed in claim 16 wherein the second coupling feature is a via post or a via hole.

19. The system as claimed in claim 16 further comprising:
a first insulation layer directly on the contact and the wafer substrate having a contact opening over the contact;
a second insulation layer directly on the first insulation layer having a contact opening over the contact; and
a metal layer directly on the second insulation layer and the contact.

20. The system as claimed in claim 16 wherein the wafer substrate includes:
the wafer substrate having a via recess extending through the wafer substrate; and
the wafer substrate having a via rim recess along an outer circumference of the via recess.

* * * * *